United States Patent [19]

Kultgen et al.

[11] Patent Number: 4,760,346

[45] Date of Patent: Jul. 26, 1988

[54] SWITCHED CAPACITOR SUMMING AMPLIFIER

[75] Inventors: Michael A. Kultgen, Bedford; Danny T. Pinckley, Arlington, both of Tex.

[73] Assignee: Motorola, Inc., Schaumburg, Ill.

[21] Appl. No.: 913,424

[22] Filed: Sep. 30, 1986

[51] Int. Cl.[4] .................................... H03F 1/00

[52] U.S. Cl. .................................... 330/69; 307/243; 330/51; 330/107; 330/147

[58] Field of Search ................. 330/51, 107, 109, 147, 330/69; 307/243; 328/154, 158; 333/173

[56] References Cited

U.S. PATENT DOCUMENTS

| | | | |
|---|---|---|---|
| 4,110,708 | 8/1978 | Mendenthall | 330/86 X |
| 4,210,872 | 7/1980 | Gregorian | 330/9 |
| 4,313,096 | 1/1982 | Fleischer | 328/151 X |
| 4,600,904 | 7/1986 | Shumaker | 333/173 |
| 4,604,584 | 8/1986 | Kelley | 330/9 |
| 4,659,996 | 4/1987 | Nadir | 328/167 |

FOREIGN PATENT DOCUMENTS 0015343 9/1980 European Pat. Off. .

OTHER PUBLICATIONS

IEEE Journal of Solid-State Circuits, vol. SC-19, No. 4, Aug. 1984, entitled "Switch-Induced Error Voltage on a Switched Capacitor", pp. 519-525 by Bing J. Sheu, Student Member, IEEE, and Chenming Hu, Senior Member, IEEE.

IEEE Transactions on Circuits Systems, vol. CAS-25, No. 12, Dec. 1978, entitled "Design Techniques for MOS Switched Capacitor Ladder Filters" by Gordon M. Jacobs, David J. Allstot, Member, IEEE, Robert W. Brodersen, Member, IEEE, and Paul R. Gray, Senior Member, IEEE, pp. 1014-1021.

Proceedings of the IEEE, vol. 6, 0.1, Jan. 1979 entitled "MOS Switched-Capacitor Filters" pp. 61-75, by Robert W. Brodersen, Member, IEEE, Paul R. Gray, Senior Member, IEEE and David A. Hodges, Fellow, IEEE.

1980 IEEE, entitled "A Prewarping Scheme for the Design of Switched-Capacitor Filters" pp. 317-320, by U. W. Brugger, B. J. Hosticka, Institute of Telecommunications, Swiss Federal Institute of Technology, Zurick, Switzerland.

1980 IEEE, entitled "Effects of the Op AMP Finite Gain and Bandwidth on the Performance of Switched Capacitor Filters", pp. 321-325, by Ken Martin and Adel S. Sedra, Department of Electrical Engineering, University of Toronto, Toronto, Ontario, Canada MSS 1A4.

IEEE International Symposium on Circuits and Systems, 1980 entitled "MOS Switched Capacitor High-pass/Notch Ladder Filters, pp. 309-312, by Titkwan Hui and David J. Allstot, Central Research Laboratories, Texas Instruments Inc., Dallas, TX.

IEEE Transactions on Circuits and Systems, vol. CA-S-25, No. 12, Dec. 1978, entitled "Switched-Capacitor Filter Design Using the Bilinear z-Transform, pp. 1039-1044 by Gabor C. Temes, Fellow, IEEE, H. J. Orchard, Fellow, IEEE, and Masood Jahanbegloo.

IEEE Transactions on Circuits and Systems, CAS 28, No. 8, Aug. 1981, pp. 811-822, entitled "Bilinear Switched-Capacitor Ladder Filters" by Man Shek Lee, Member, IEEE, Gabor C. Temes, Fellow, IEEE, Chieh Chang, and Mir Bahram Ghaderi, Student Member, IEEE.

*Primary Examiner*—James B. Mullins

*Attorney, Agent, or Firm*—Thomas G. Berry

[57] ABSTRACT

A switch capacitor summing amplifier is disclosed having a coupling means to couple desired signals to the active amplifier in response to an enable signal. The coupling is performed in synchronism to the "odd" phase of the sampling signals thereby improving noise, transient and DC offset performance while minimizing switch impedance sensitivity.

14 Claims, 6 Drawing Sheets

100

—PRIOR ART—

200

-PRIOR ART-

400

500
504
502
502'
501
503
506
508
508'
510
512
514
516
518
520
522
522'
524
525
526
$V_{OUT}$ TO FILTER
EVEN
ODD
D
Q
E
VOICE LEVEL 1
VOICE LEVEL 2
VOICE
PL ENABLE
PL

600

SWITCHED CAPACITOR SUMMING AMPLIFIER

TECHNICAL FIELD

This invention relates generally to filter networks and more particularly to switched capacitor filter networks, and is more particularly directed towards an improved switch capacitor summing amplifier that may be used in conjunction with switch capacitor filters.

BACKGROUND ART

Switched capacitor filters are known. Such filters are the product of filter designing techniques to miniaturize filters, which are often reduced to integrated circuit (IC) form. A switch capacitor filter utilizes the fact that when a capacitor is switched between a signal to be sampled and ground at a frequency many times the frequency of the sampled signal, the capacitor will simulate the circuit behavior of a resistor. In the design of switched capacitor filters, summing amplifiers are frequently employed as an input section to select one or more signals to be filtered by the switch capacitor filter. Such a summing amplifier is illustrated in FIG. 1. The switch capacitor summing amplifier 100 is comprised of a plurality of input circuits 102 and a conventional switch capacitor amplifier 104. Each input section is coupled to amplifier 104, which sums any of the input voltage signals that may be present ($V_1$–$V_n$) and provides an output signal 114. Each of the input sections 102 is comprised of two MOS transistor switches 106 and a capacitor 108. The amplifier 104 is comprised of an operational amplifier 116 having feedback capacitors 110 and 112, and has a pair of sampling switches (106) at the input and output. The OP amp (116) provides an output signal 114, which may be advantageously filtered by any suitable switched capacitor filter known in the art. As is readily understood in the art, there are commonly two phases of sampling associated with the switches 106. These are an even phase and an odd phase. Typically, these signals are of complementary phase and are easily generated using an inverter or functional equivalent. All the switches marked "even" are closed simultaneously, then opened followed by a closure of all the switches marked "odd".

Frequently, the summing amplifier 100 operates as a signal selector and often has all but one of its signal sources disabled. However, the continued connection of the remaining unused inputs seriously impact performance of the summing amplifier 100. If the unused inputs are allowed to "float", parasitic charge may couple across the capacitor 108 and cause shifts in the frequency response of the summing amplifier 100. Conversely, if the unused inputs are connected to an AC ground, the input noise, DC offset and switch impedance sensitivity of the amplifier 104 are severely degraded. Thus, there is a need in the art to provide a switch capacitor amplifier that operates to select various input signals without degrading the performance of the following switch capacitor filter.

SUMMARY OF THE INVENTION

Accordingly, it is an object of the present invention to provide an improved switch capacitor summing amplifier.

It is another object of the present invention to provide a switch capacitor summing amplifier which effectively removes unused input ports from the circuit.

It is yet another object of the present invention to provide an improved switch capacitor summing amplifier which removes unused input ports in synchronism to the switching signals.

Accordingly, these and other objects are achieved by the present switch capacitor summing amplifier.

Briefly, according to the invention, a switch capacitor summing amplifier is provided with a coupling means to couple desired signals to an amplifier in response to a selection signal. The coupling is performed in synchronizm to one of the phases of the sampling signal thereby improving noise, transient and DC offset performance, while minimizing switch impedance sensitivity.

BRIEF DESCRIPTION OF THE DRAWINGS

The features of the present invention which are believed to be novel are set forth with particularity in the appended claims. The invention, together with further objects and advantages thereof, may be understood by reference to the following description, taken in conjunction with the accompanying drawings, and the several figures of which like reference numerals identify like elements, and in which:

DETAILED DESCRIPTION OF THE PREFERRED EMBODIMENT

Figure 2:
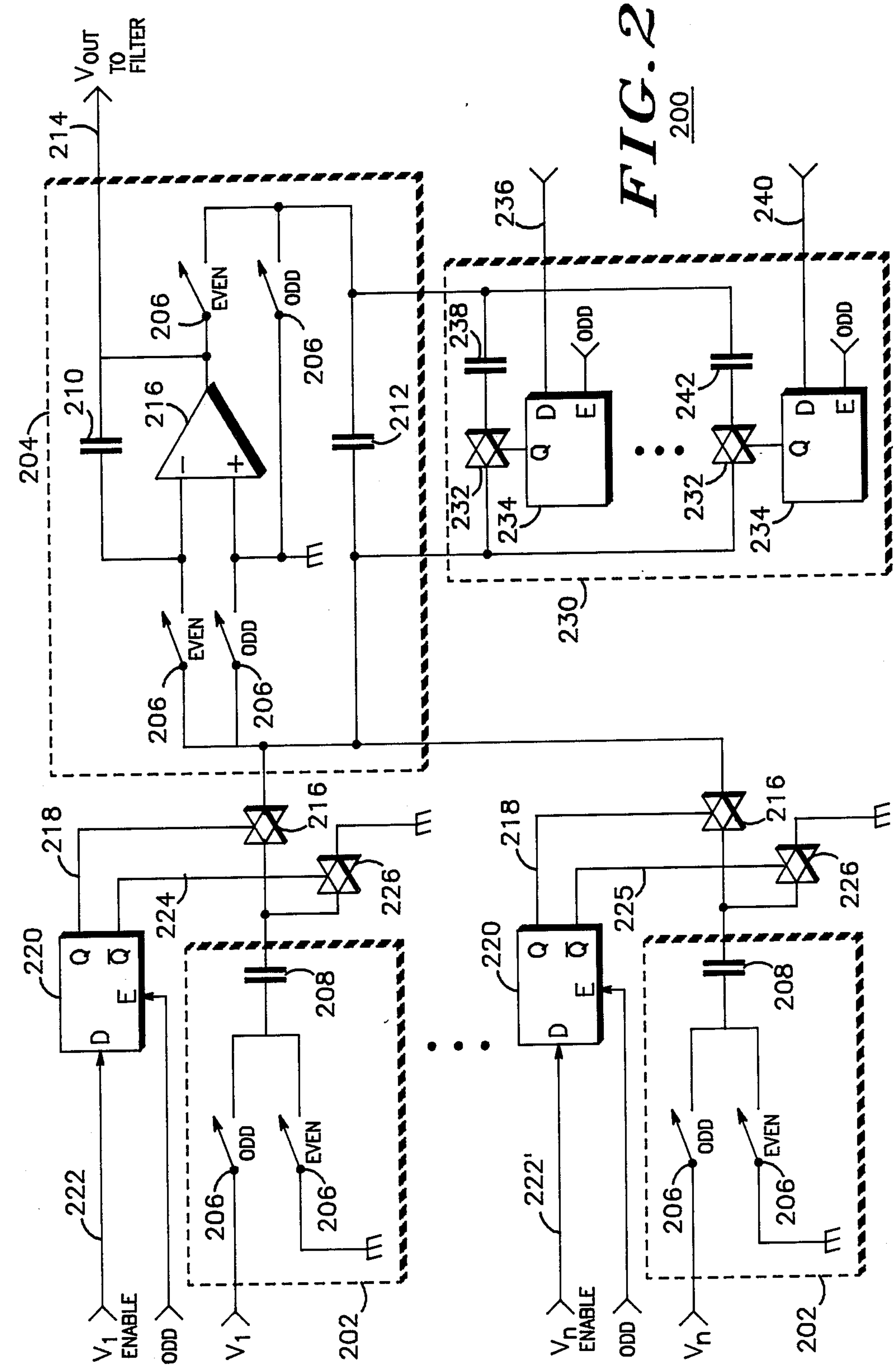
FIG. 2 is a schematic diagram of a switched capacitor summing amplifier according to the present invention.

Referring now to FIG. 2, the switch capacitor summing amplifier of the present invention is shown. The summing amplifier 200 is comprised of a plurality of input circuits 202 each having a pair of MOS switches 206 and an input capacitor 208. The amplifier portion 204 is comprised of an operational amplifier 214 having a pair of switches at its input and output port and feedback capacitors 210 and 212. Optionally, the amplifier 204 is coupled to a gain change network 230. The value of the capacitor 212 may be changed by adding (capacitors add in parallel) one or more capacitors. For example, a capacitor 238 may be added by asserting the enable line 236. The transmission gate 232 will couple any capacitor having an asserted enable line on the next rising edge of the odd sampling signal. Of course, the same technique may be used on the capacitor 208 or 210. Moreover, this technique may be carried into any switched capacitor filter that may follow the summing amplifier 200.

Each of the input sections 202 is coupled to the amplifier 204 via a transmission gate 216. The transmission gate 216 is activated by a control signal 218, which is provided from a latch 220. The signal 218 is provided by the latch 220 on the first rising edge of the "odd" sampling clock after the assertion of the $V_1$ enable line 222. However, if the $V_1$ enable signal 222 negates (i.e., logical 0) during the odd phase of the sample signal, the transmission gate 216 will immediately remove the $V_1$ signal source from the circuit. Additionally, if the enable line 222 is a logical zero, the Q output of the latch 220 will provide a signal 224 to the transmission gate 226. The control signals 224 and 218 are opposite phase signals so that when the transmission gate 216 is on, the transmission gate 226 is off, and vice versa. Therefore, when the transmission gate 216 is off a connection from the capacitor 208 to ground is made by the transmission gate 226. The latch 220 synchronizes the activation and deactivation of the transmission gates 226 and 216 such that transients are not coupled into the amplifier 204 (due to the switching of the transmission gates). Thus, it is not sufficient to merely decouple the unused input stages 202. It is the synchronizing aspect of the present invention that provides the superior performance over merely decoupling the unused input ports. Additionally, it has been discovered that switching transients are a particular problem on the "even" phase of the sampling signal, therefore, each latch 220 is activated upon the "odd" phase of the sampling signal to further reduce the conducted transients. Moreover, in a broader, more general aspect of the present invention, the synchronized gain change (capacitor addition) operates to allow gain and/or bandwidth changes in the summing amplifier 200 or a switched capacitor filter (not shown). Thus, the switch capacitor amplifier 200 of the present invention completely removes, synchronously, any unused input sections from the amplifier 204 thereby minimizing noise, switch impedance sensitivity and DC offsets.

Figure 1:
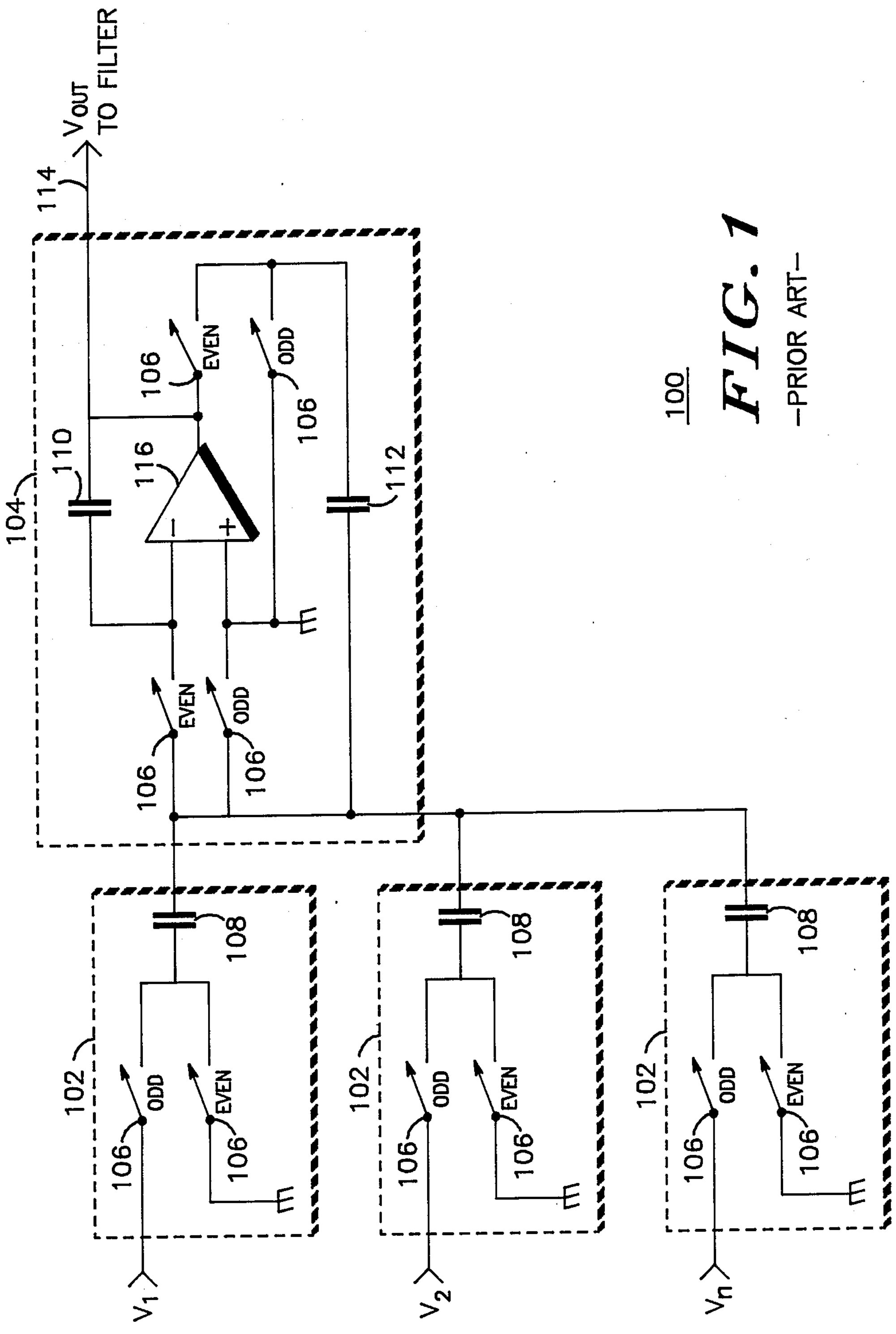
FIG. 1 is a schematic diagram of a switched capacitor summing amplifier according to the prior art.
Figure 3A:
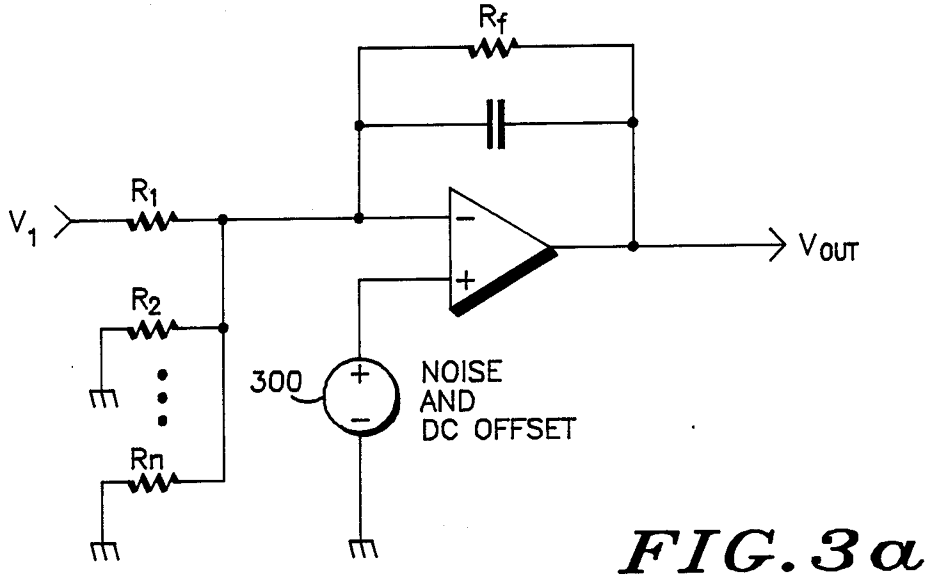
FIG. 3*a* is a continuous-time equivalent circuit of the summing amplifier of FIG. 1.
Figure 3B:
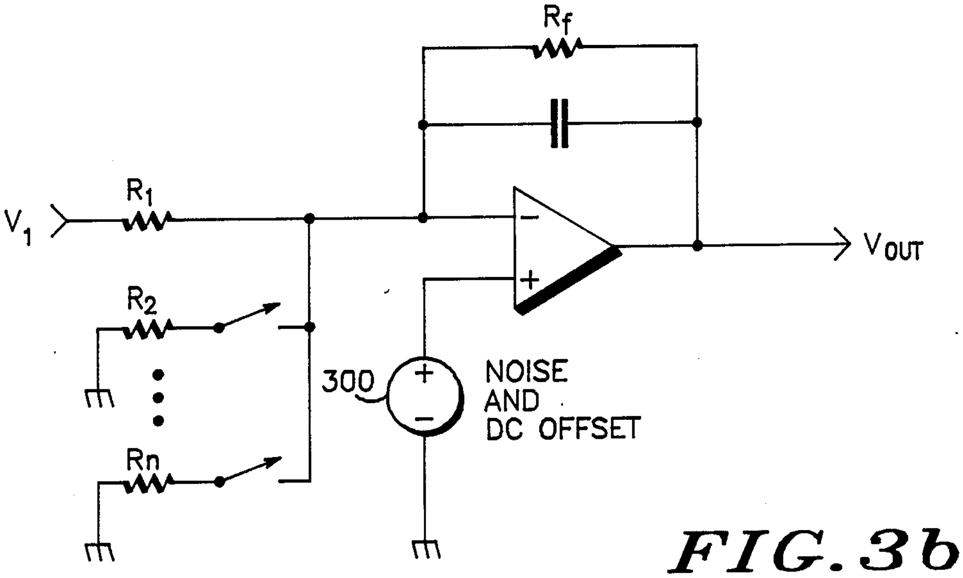
FIG. 3*b* is a continuous-time equivalent circuit of the summing amplifier of FIG. 2.

Referring now to FIGS. 3*a* and 3*b*, a continuous-time equivalent circuit of the prior art amplifier 100 and the present invention amplifier 200 are shown (respectively). Those skilled in the art will appreciate that an element by element analogy may be made between the circuits of FIG. 1 and FIG. 3*a* and the circuit of FIG. 2 and FIG. 3*b*. Due to the principles of virtual ground, the gain presented to the signal $V_1$ in FIG. 3*a* is:

$$A_{V1} = R_f/R_1 \quad (1)$$

However, the gain provided to the equivalents noise and DC offset source 300 is:

$$A_{noise} = 1 + \frac{(R_f(R_1 + R_2 + \ldots R_n))}{(R_1 \times R_2 \times \ldots R_n)} \quad (2)$$

As an example, and not as a limitation, assume that one of five possible input sources is activated and that all of the resistors in FIG. 3*a* are equal. In such a case, the gain provided to the signal $V_1$ would be 0 dB and the gain provided to the noise and offset source 300 would be 16 dB. Referring now to FIG. 3*b*, assuming only $V_1$ of a plurality of sources is coupled to the amplifier, the remaining resistors $R_2$–$R_N$ would be completely removed due to the switches, which represent the transmission gates 226 and 216 of FIG. 2. In FIG. 3*b*, the gain provided to the signal $V_1$ is the same as equation (1), while the gain provided to the equivalent noise and offset source 300 is:

$$A_{noise} = 1 + (R_f/R_1) \quad (3)$$

Assuming the same example of 5 voltage sources (only one of which is used and all resistors being equal) the gain provided to the signal $V_1$ remains 0 dB. However, the gain provided to the noise and offset source 300 is reduced to 6 dB. This represents a 10 dB improvement in hum and noise performance and DC offset.

Figure 4:
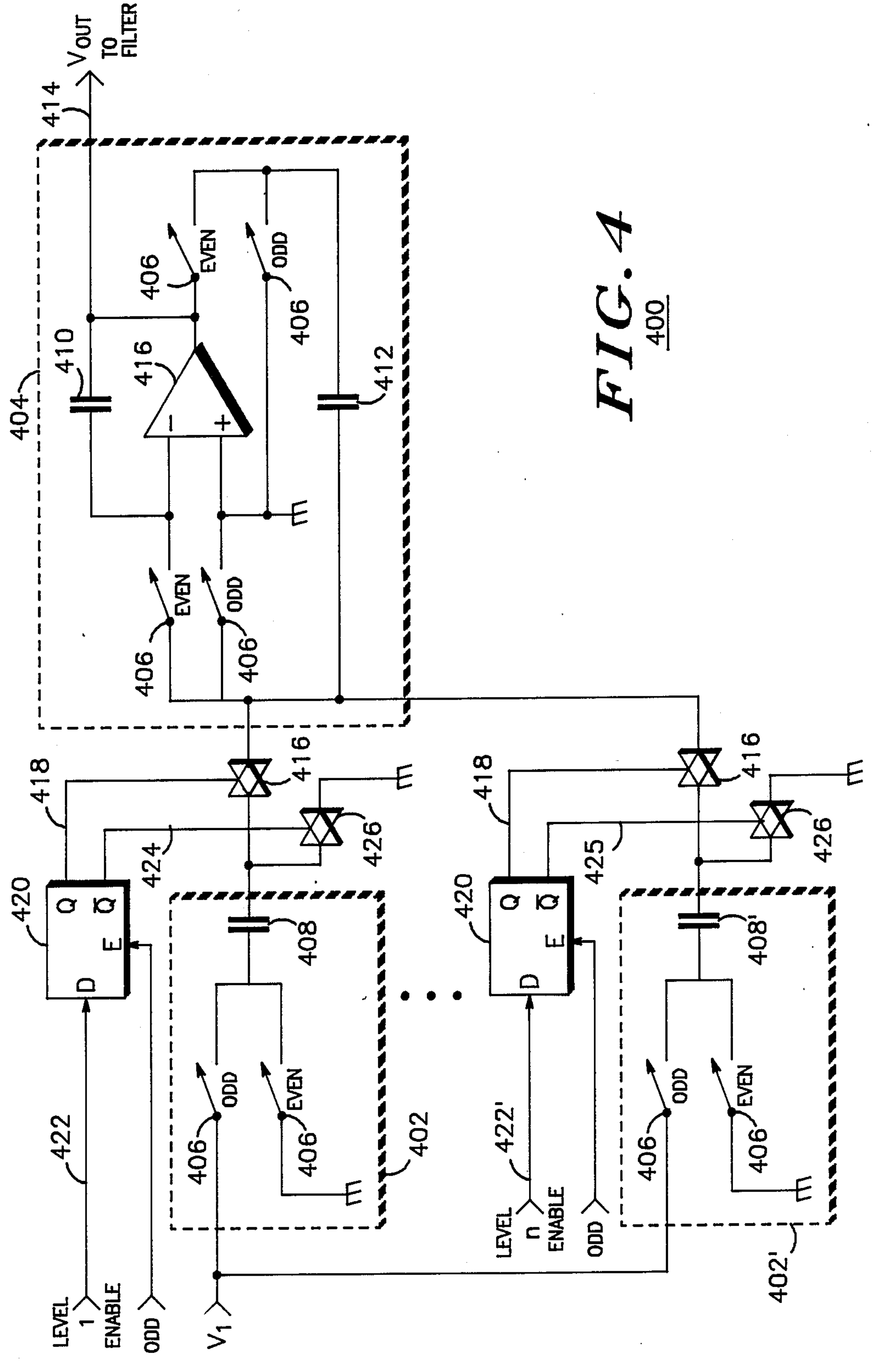
FIG. 4 is an alternate embodiment of the summing amplifier of FIG. 2.

Referring now to FIG. 4, an alternate embodiment of the present invention is shown. The summing amplifier 400 is comprised of the same basic blocks as the invention of FIG. 2. However, the desired signal $V_1$ is coupled to 2 input sections 402 and 402'. The primary difference between these two sections is the coupling capacitor 408 and 408'. By selecting appropriate values for these capacitors, various levels of the input signal $V_1$ can be routed via the amplifier 404 to the switched capacitor filter via the output line 414. A first level may be selected by activating the level 1 enable line 422. Other levels may be selected by activating an appropriate enable line or combination of enable lines. Those skilled in the art will appreciate that virtually any number of input sections 402 may be provided as input sections to the amplifier 404.

Figure 5:
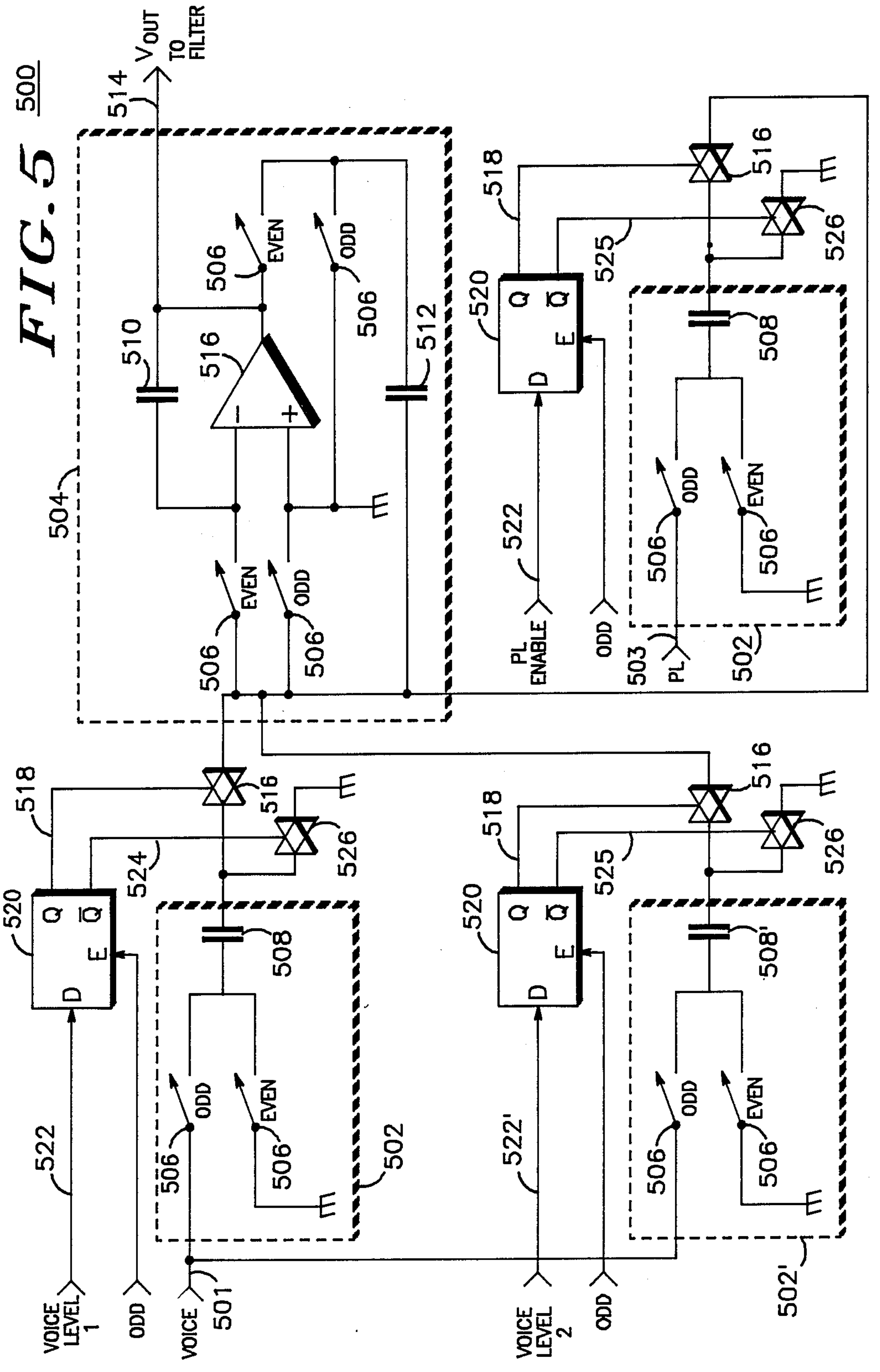
FIG. 5 is another alternate embodiment of the summing amplifier of FIG. 2.

Referring now to FIG. 5, yet another embodiment of the present invention is shown. In FIG. 5, the summing amplifier 500 routes a voice signal 501 to an input circuits 502 and 502'. This operates to select different levels of the voice signal as was shown in FIG. 4. Additionally, signalling information, such as a Private Line (PL signal 503), may be summed with the voice signal through the input section 502 as is shown. Of course, additional circuits could be used to select different levels of the PL signal 503 and those skilled in the art will appreciate the varied combinations of levels and signals that are possible using the techniques of the present invention.

Figure 6:
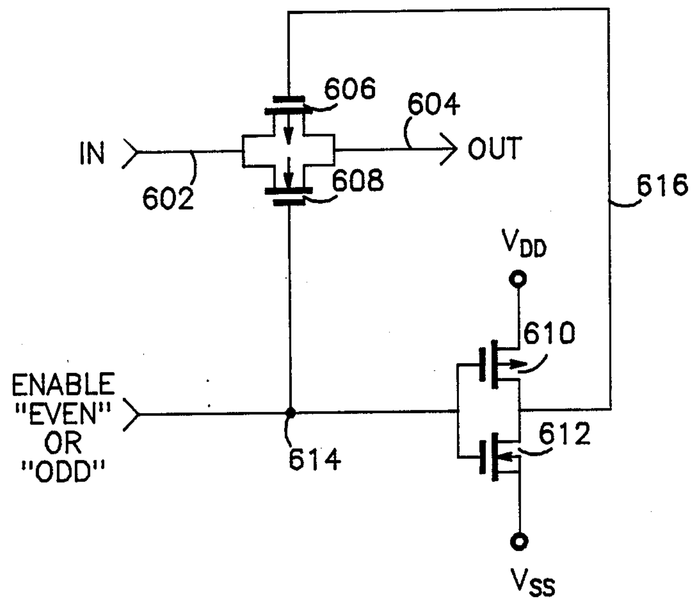
FIG. 6 is a schematic diagram of a MOS implementation of one switch.

Referring now to FIG. 6, the preferred embodiment of a MOS transistor switch 600 is shown. In the preferred embodiment of the present invention, each switch 206 is implemented using metal oxide semiconductor (MOS) transistor techniques. The switch 600 is arranged in the convention SPST form having an input port 602 and an output port 604. When the enable line 614 (either the "even" sampling signal or the "odd" sampling signal) is logical 1, the transistor 612 pulls the control line 616 to logical 0, which activates the transistor 606. The transistor 608 is also activated and the switch is "closed". Conversely, when the enable signal 614 is a logical 0, the transistor 610 pulls the control line 616 to logical 1 and both the transistors 606 and 608 are off and the switch 600 is "open".

While a particular embodiment has been described and shown, it should be understood by those of ordinary skill in the art that the present application is not limited thereto since many modifications may be made. In particular, the present invention contemplates the use of any suitable temperature compensation or stability techniques as is well known in the art. Accordingly, it is therefore contemplated to cover by the present application any and all such modifications that may fail within the true spirit and scope of the basic underlying principles disclosed and claimed herein.

What is claimed is:

1. A switched capacitor summing amplifier, comprising:
   - means for generating a first and second sampling signal being of complementary phase;
   - at least one amplifier stage, coupled to said generating means, said at least one amplifier stage having an input port and an output port;
   - at least one input stage, coupled to said generating means, said at least one input stage having an input port and an output port;

means for removably coupling said output port of any of said input stages to said input port of said amplifier stage in response to a control signal; and means for providing said control signal synchronized to at least one of said first and second sampling signals.

2. A switched capacitor summing amplifier, comprising:

means for generating a first and second sampling signal being of complementary phase;

at least one amplifier stage, coupled to said generating means, said at least one amplifier stage having an input port and an output port;

a plurality of input stages each coupled to said generating means, said plurality of input stages each having an input port and an output port;

means for removably coupling said output port of any of said input stages to said input port of said amplifier stage in response to a control signal; and means for providing said control signal synchronized to at least one of said first and second sampling signals.

3. In a switched capacitor filter having an input and an output, a switched capacitor summing amplifier coupled to the input of the switched capacitor filter, comprising:

means for generating a first and second sampling signal being of complementary phase;

at least one amplifier stage, coupled to said generating means, said at least one amplifier stage having an input port and an output port;

a plurality of input stages each coupled to said generating means, said plurality of input stages each having an input port and an output port;

means for removably coupling said output port of any of said input stages to said input port of said amplifier stage in response to a control signal; and means for providing said control signal synchronized to at least one of said first and second sampling signals.

4. In a switched capacitor filter having an input and an output, a switched capacitor summing amplifier coupled to the input of the switched capacitor filter, comprising:

means for generating a first and second sampling signal being of complementary phase;

at least one amplifier stage, coupled to said generating means, said at least one amplifier stage having an input port and an output port;

at least one input stage, coupled to said generating means, said at least one input stage having an input port and an output port;

means for removably coupling said output port of any of said input stages to said input port of said amplifier stage in response to a control signal; and means for providing said control signal synchronized to at least one of said first and second sampling signals.

5. The switched capacitor summing amplifier of claims 1, 2, 3 or 4, wherein said at least one amplifier stage comprises an operational amplifier having capacitive feedback.

6. The switched capacitor summing amplifier of claim 5, which includes:

means for asserting at least one enable signal synchronized to at least one of said first and second sampling signals; means for coupling at least one capacitor in parallel to said capacitive feedback of said amplifier stage in response to said enable signal.

7. The switched capacitor summing amplifier of claims 1, 2, 3 or 4, wherein any of said input stages comprise a pair of MOS transistor switches coupled to at least one capacitor.

8. The switched capacitor summing amplifier of claims 1 or 4, wherein said coupling means comprises at least one transmission gate serially disposed between said at least one input stage and said at least one amplifier stage.

9. The switched capacitor summing amplifier of claim 8, which further includes at least one transmission gate for selectively coupling the output port of said at least one input stage to ground.

10. The switched capacitor summing amplifier of claims 1, 2, 3 or 4, wherein said providing means comprises a binary latch.

11. The switched capacitor summing amplifier of claims 1, 2, 3 or 4, which includes means for synchronously changing the gain of said amplifier.

12. The switched capacitor summing amplifier of claim 11, which includes:

at least one capacitor constructed and arranged to be removeably parallel coupled to at least one capacitive feedback capacitor of said amplifier in response to a control signal;

means for synchronously providing said control signal in response to at least one of said first and second sampling signals.

13. The switched capacitor summing amplifier of claims 2 or 3, wherein said coupling means comprises at least one transmission gate serially disposed between said plurality of input stages and said at least one amplifier stage.

14. The switched capacitor summing amplifier of claim 13, which further includes at least one transmission gate for selectively coupling the output port of at least one of said plurality of input stages to ground.

* * * * *